United States Patent [19]

Smarandoiu et al.

[11] Patent Number: 5,898,605

[45] Date of Patent: Apr. 27, 1999

[54] APPARATUS AND METHOD FOR SIMPLIFIED ANALOG SIGNAL RECORD AND PLAYBACK

[76] Inventors: George Smarandoiu, 1136 Littleoak Cir., San Jose, Calif. 95129; Emil Lambrache, 1054 S. Winchester Blvd. #15, San Jose, Calif. 95128

[21] Appl. No.: 08/896,084

[22] Filed: Jul. 17, 1997

[51] Int. Cl.[6] .................................................. G11C 27/00
[52] U.S. Cl. ........................................... 365/45; 365/33
[58] Field of Search ............................ 365/45, 33; 386/46

[56] References Cited

U.S. PATENT DOCUMENTS

| | | | |
|---|---|---|---|
| 4,890,259 | 12/1989 | Simko | 365/45 |
| 4,989,179 | 1/1991 | Simko | 365/45 |
| 5,126,967 | 6/1992 | Simko | 365/45 |
| 5,220,531 | 6/1993 | Blyth et al. | 365/189.07 |
| 5,241,494 | 8/1993 | Blyth et al. | 365/45 |
| 5,294,819 | 3/1994 | Simko | 257/314 |
| 5,561,530 | 10/1996 | Kanazawa | 386/46 |

*Primary Examiner*—David Nelms
*Assistant Examiner*—Thong Le
*Attorney, Agent, or Firm*—Sierra Patent Group, Ltd.

[57] ABSTRACT

A complete voice record and playback system capable of being powered by a single 1.8 VDC battery is operated in either stand-alone or CPU modes. In the stand-alone mode, two-button operation controls record, play, and memory erase functions. In CPU mode, commands may be provided through a serial interface which directly control record, playback, specialized memory management functions, and power amplifier gain settings. Through a serial interface, the system may be set up to directly write to external memory, using an analog signal generated by a microphone or other analog input device, or may instead be set up so that digital data provided by an external CPU and converted to analog using the on-chip D/A converter may be output by the speaker in real-time.

26 Claims, 6 Drawing Sheets

APPARATUS AND METHOD FOR SIMPLIFIED ANALOG SIGNAL RECORD AND PLAYBACK

BACKGROUND OF THE INVENTION

1. Field of the Invention

This invention relates to the field of analog signal record and playback using nonvolatile memory.

2. The Background Art

The use of recording systems for the storage and playback of audio messages is well known. Conventional recording systems are roughly categorized into two areas, those using magnetic streaming tape as the storage media, and those using semiconductor memory devices as the storage media.

Conventional systems using streaming magnetic tape as the storage media generally take an input signal generated by a microphone, amplify it, filter it in preparation for storage, and then record the signal onto magnetic tape provided for that purpose. Playback of the recorded signals may be accomplished by a user of the system using hand-operated controls provided for that purpose.

In order that a user of the system may operate the recording device, controls are provided so that a user may select such functions as record, playback, erase, power on, fast forward, fast reverse, pause, and stop. Using these functions, a user is able to record new messages, review or erase old messages, and perform other functions. Although these recording systems are useful for their intended purposes, they are often too complex and large to be used as hand-held devices, and are difficult to store in a person's pocket. It is therefore beneficial to provide a system wherein the operation of the system can be simplified, but where all normal functions are available for use in more complex situations.

Digital voice recording systems using semiconductor devices as the storage media typically amplify the incoming microphone audio, digitize the amplified signal using an analog-to-digital converter (ADC), and then store the resulting digital data in a semiconductor memory device. As in a conventional system which uses a magnetic tape for storage, the user may request the playback of a recorded signal in the digital system using controls provided for that purpose. Initiating the playback of a message typically causes the system controller to access the memory, process the information stored there through a digital-to-analog converter, amplify the resulting analog signal, then route the signal to an output device such as a speaker.

One such conventional device is described in U.S. Pat. No. 4,890,250 to Simko. In this system, eight command input buttons control the operation of system functions, include power on, record, playback, erase, fast forward, fast reverse, pause, and stop functions. Though useful for its intended purposes, due to the complexity of its 8-button command interface, this system is inadequate for applications requiring minimal complexity such as in a hand-held system which might be stored in a person's pocket. Therefore, it would be advantageous to provide a record and playback system which utilizes simplified user controls.

OBJECTS AND ADVANTAGES OF THE INVENTION

It is an object and advantage of the present invention to provide a voice recording and playback system which comprises a simplified user interface.

It is a further object and advantage of the present invention to provide an efficient method for managing data stored in a nonvolatile memory circuit.

It is yet a further object and advantage of the present invention to provide a voice record and playback system capable of being controlled by an external CPU or state machine.

Yet a further object and advantage of the present invention is to provide a voice record and playback system wherein digital information provided over a serial port may be stored directly to memory.

It is a fifth object and advantage of the present invention to provide a voice record and playback system wherein digital information provided over a serial interface may be converted to audio and output to a speaker or other audio output device.

These and many other objects and advantages of the present invention will become apparent to those of ordinary skill in the art from a consideration of the drawings and ensuing description of the invention.

SUMMARY OF THE INVENTION

A voice record and playback system according to a presently preferred embodiment of the present invention comprises a command interface, a controller which acts upon commands issued by the command interface, nonvolatile memory circuits for storing digital information, an oscillator for controlling the sampling frequency of the system, various amplifier circuits for amplifying signals, sample and hold circuits and digital to analog converters for converting signals, and a filter section.

A presently preferred embodiment of the present invention is operated in a stand-alone mode using push-buttons, or in a CPU mode by executing commands provided by a CPU or state machine through a serial interface provided for that purpose. In a stand-alone mode, two push-button operation controls record, play, skip and memory erase functions. In a CPU mode, commands provided by a CPU or state machine directly control record, playback, specialized memory management functions, and input amplifier gain settings. A novel memory management scheme provides efficient use of valuable memory storage space, and provides byte-level control of memory while the system is in CPU mode.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
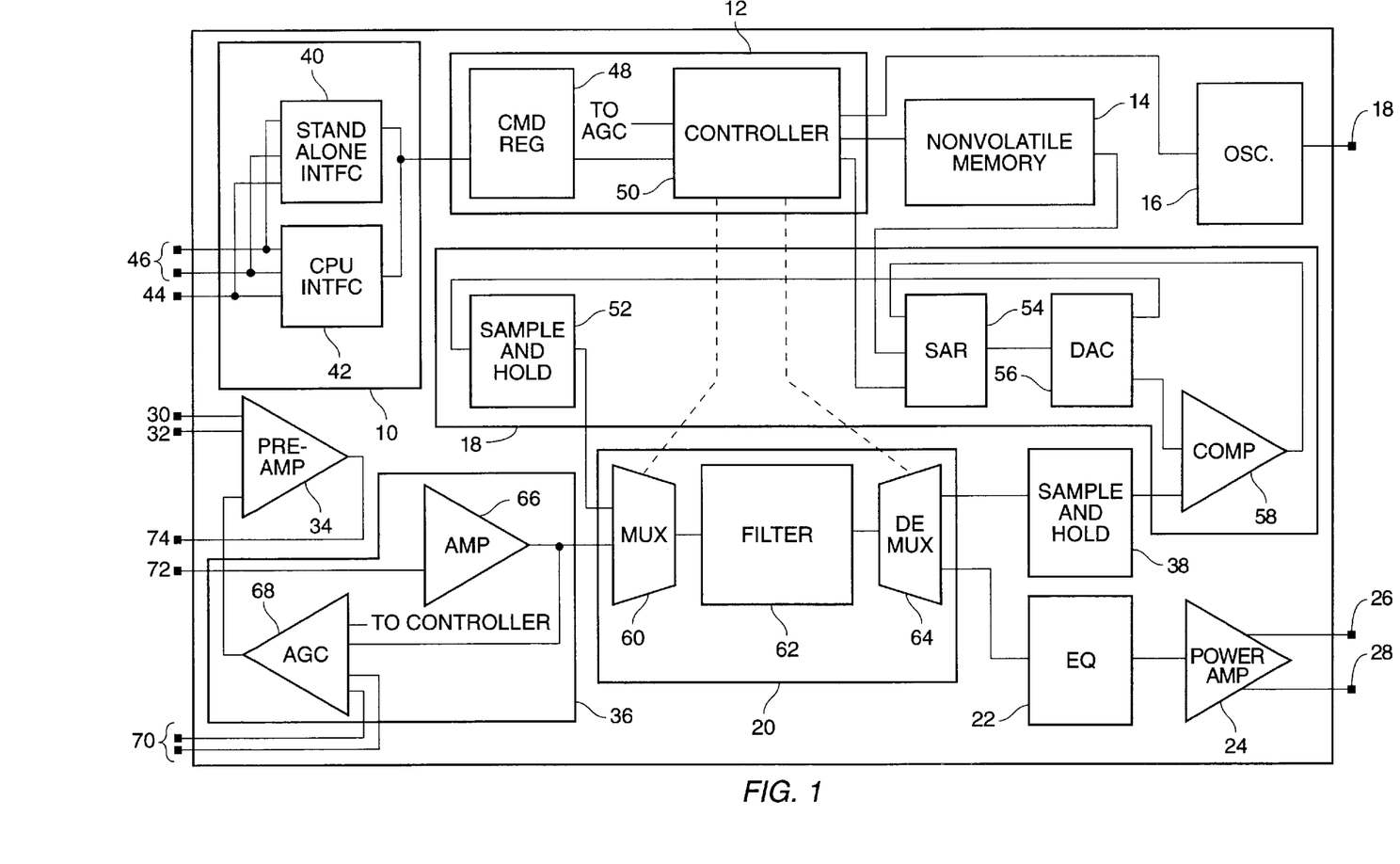
FIG. 1 is a block diagram of a presently preferred embodiment of the voice record and playback system of the present invention.

FIG. 1 is a block diagram of a presently preferred embodiment of the voice record and playback system of the present invention. Although a presently preferred embodiment of the present invention comprises a single integrated circuit, it is contemplated that other embodiments might contain two or more integrated circuits and still remain within the scope and spirit of the present invention.

Referring to FIG. 1, command interface 10 comprises a collection of logic gates designed to interpret command inputs as is known in the art. The particular configuration of these gates may be readily determined using standard logic design methods known in the art. Control interface 12 which receives input from command interface 10 also comprises a collection of logic gates, the design of which is also developed using manual means or through the use of a logic synthesizer. Control interface 12 acts upon commands issued by the command interface, and is responsible for the general operation of the components of the system. In a presently preferred embodiment of the present invention, control interface 12 comprises an instruction decoder, the construction of which is well-known to those of ordinary skill in the art.

Memory 14, which preferably comprises flash memory, stores digital information resulting either from digitized audio, or provided over a serial interface by the CPU or state machine. Other types of memory, such as EEPROMS, will work, but flash memory is preferred for its higher density.

Oscillator 16 is preferably a relaxation oscillator, but could also be a voltage controlled oscillator or other oscillator suitable for operation as a part of an integrated circuit.

Sample and hold circuits 38 and 52 are well-known by those of ordinary skill in the art, and may comprise two or more field effect transistors coupled together as a complementary pair, with a capacitor on the output which stores the charge being digitized. Other types of sample and hold circuits are well known to those of ordinary skill in the art, and would work equally well.

Amplifiers 24, 34, and 66 comprise operational amplifiers well-known by those of ordinary skill in the art.

Multiplexer 60 and de-multiplexer 64 comprise circuits well known to those of ordinary skill in the art. Preferable, multiplexer 60 is a 2 to 1 multiplexer, i.e., two input lines switched into a single output, the control line of which is coupled to command interface 12. In the same way, de-multiplexer 64 is preferably a 1 to 2 demultiplexer, i.e., one input line switched into either of two outputs, also controlled by command interface 12.

Anti-aliasing filter 62 is a standard filter known to those of ordinary skill in the art. It is used in order to eliminate unwanted frequencies which develop when the frequency of a signal being sampled is more than one-half of the sampling rate. The necessary filter is a low-pass filter which attenuates frequencies above one-half of the sampling rate.

When a user of the system initiates a command function such as to replay a prior recorded message, command interface 10 receives the command and causes control interface 12 to issue more specific commands which are acted upon by other components of the system. For instance, where a user requests that a prior recorded message be replayed, command interface 10 causes control interface 12 to retrieve the message from memory 14, convert it to analog form using D/A circuits 18, then filter it using filter section 20, and then process the signal through equalizer 22. Equalizer 22 is used to add back high frequency components of the signal which are typically lost during the digitizing process. The resulting signal is then amplified by power amplifier 24, and output to a speaker or other analog output device through pins 26 and 28.

A record operation initiated by a user of the system causes the system to amplify an incoming audio signal at pins 30 and 32 using pre-amplifier 34, level it using amplifier section 36, filter it using filter section 20, digitize it using sample-and-hold 38, and D/A circuits 18, store the resulting digital data in memory 14.

In the stand-alone mode, an erase function initiated by a user of the system causes control interface 12 to erase the entire memory space by writing zeros to all memory locations. In an alternative embodiment of the system, an erase function would provide the user the opportunity of erasing a particular message which has already been replayed. If, for instance, the system contains many messages and the third message is to be erased, the user would replay that third message and then initiate the erase function which would write zeros into the space occupied by the third message. The fourth message would then be moved into the space previously occupied by the deleted third message, and the fifth message would be moved into the memory space previously occupied by the fourth message, and so on until all messages have been moved. The system would then be able to record a message beginning at the sector which follows the last recorded message.

Due to the desirability of maximizing the efficiency of memory 14, special memory management techniques are employed. In a presently preferred embodiment of the present invention, available memory is divided into sectors. Although it is not required that each sector be a particular size, it is preferred that all sectors be equal sizes. In a presently preferred embodiment of the present invention, each sector is 16 Kbytes in length, yielding voice messages of approximately 2.56 seconds in duration (at the nominal sampling frequency of 6.4 KHz).

The entire memory can be free of messages, or may contain from one to N messages, where N is the number of memory sectors allocated for recording messages. The message map is managed through the use of a "marker" system which begins new messages at the beginning of a new sector, regardless of where a previously recorded message may have ended in memory. The marker is the first byte in each sector.

A zero byte at the beginning of a sector marks either the start of a message, or the beginning of empty memory. If the zero byte is immediately followed by nonzero data, the nonzero byte marks the start of a recorded message. If the zero byte is followed by an empty memory byte, the zero byte marks the beginning of empty memory which may be used when recording a new message.

When a recording operation begins, the system locates the next available message area by inspecting markers and second bytes from the top of memory, and then recording into the first memory sector identified with a first zero byte followed by an empty memory byte.

After the first empty sector is identified, the system records data into that sector beginning with the second byte, leaving the marker empty to identify that sector as the first sector of a recorded message. If the message being recorded spans more than one sector, data is recorded into the second and subsequent sectors beginning with the first byte of those second and subsequent sectors.

Under this scenerio, messages would be recorded from the second byte of a new message area until recording is stopped, or until the end of available memory is reached, whichever occurs first.

It is possible that the first data byte of the first sector of a recorded message, i.e., the second memory byte of that first sector, has a value of zero. Under the system just described, the sector might erroneously be identified as an empty sector, i.e. a sector containing zero data values in the first and second byte positions. In order to ensure that this doesn't occur, zero value data is always recorded into memory with the sign bit set. Thus, in the first sector of such a message, the first data byte would be zero, and the next byte would be a negative zero, thus showing that the first data byte (the second sector byte) is truly recorded data. This memory management method ensures that a sector which contains information will not be accidently re-recorded, thus destroying valuable information.

An alternative method of message mapping contemplated by the inventors would employ a zero marker in the first byte of the first sector of a message, and an "all written" marker in the second byte of the first sector of the same message. The "all written" marker would also be written into the first byte of all subsequent sectors containing recorded information for that same message. For instance, the "all written" marker might comprise all bits set to a "1". Under this scenerio, the marker would be read as a "0" if the majority of its bits were zero, and as a "1" if the majority of its bits were set to "1". Thus, a new message would begin with a "0" first byte, and a "1" second byte, and each subsequent sector for that message would have a "1" marker.

Referring again to FIG. 1, oscillator 16, which leads to an external pin 19, sets the sampling frequency of the system. In a presently preferred embodiment of the present invention, this sampling frequency is approximately 6.4 KHz, which provides a recordable frequency bandwidth of approximately 2.8 KHz. The sampling frequency controls the number of times per second the amplitude of the incoming audio is "sampled" and a data point taken for later storage. As an example, doubling the sampling frequency results in twice as many data points being generated from any given incoming audio signal, and as a result, twice as many data points being stored into memory. Thus, there is a tradeoff between having a higher fidelity between the incoming audio signal and the recorded data, and the necessity of recording the increased number of data points, thus increasing the memory space required to store a particular message.

Although oscillator 16 may be a voltage to frequency converter, or a voltage controlled oscillator, or any other oscillator known in the art, it is preferred that a relaxation oscillator be used. One way to accomplish this is to charge a capacitor through a resistor, and then discharge the capacitor rapidly when the voltage across the capacitor reaches a certain threshold. An operational amplifier in a schmitt trigger configuration provides a stable basis for a relaxation oscillator, as is well known to those of ordinary skill in the art.

In a presently preferred embodiment of the present invention, a sophisticated user of the system may alter the sampling frequency by electronically programming the value of an internal resistor through the use of taps and fuses. Thus, the sampling frequency may be adjusted to result in a final frequency in a range from approximately 5 KHz to approximately 8 KHz. Other types of oscillators may be used, and other sampling frequencies may be used, without exceeding the scope of the present invention.

By increasing the sampling frequency to approximately 8 KHz, the bandwidth becomes approximately 3.5 KHz, providing a higher fidelity between the incoming audio to be recorded, and the actual data stored into memory. However, as stated earlier, increasing the sampling frequency in this manner increases the amount of data being stored per second of recorded audio, thus decreasing the number of seconds that audio may be recorded before filling up the available memory.

In addition to being capable of performing user initiated record, playback, and memory erase functions in the stand-alone mode, a presently preferred embodiment of the present invention may instead receive command inputs from a CPU or state machine through a serial interface into command interface 10. In this CPU mode, commands operate in a way similar to the stand-alone mode, but allow much more control over the system.

For instance, in the stand-alone mode, momentarily depressing the play button causes the system to play messages until the last recorded message has been played. If prior recorded but unplayed messages exist in the system, as indicated by a flag set for this purpose for each message in this category, the system will play these messages when the play command is issued. However, if no unplayed messages exist in the system, all messages are played, beginning at the top of memory. As discussed earlier, messages are located using the message marker as a guide together with, in an alternative embodiment memory mapping method also described earlier, the "all written" marker.

Pressing the play button while a message is being played results in the system skipping to the next message in line and playing it. In the CPU mode, a play command contains a number identifying the first sector to be played. While that sector is being played, the system allows the CPU or state machine to provide the address for the next sector to be played anytime prior to the play operation finishing. The play operation continues until either no additional sector addresses are supplied, or a terminate audio command is received.

Correspondingly, while depressing the button which controls the record function in the stand-alone mode, the system will locate the proper sectors to record into, and fill memory with data until either the button is released or memory becomes completely filled. If, when a record command is issued, no memory is available for recording, the command is converted to a play command, thus playing either previously recorded but unplayed messages, or playing messages from the top of memory, depending on the previously described play command function.

In the CPU mode, a record command issued over the serial interface contains the first sector to be recorded. While that sector is recorded, the system allows the CPU or state machine to provide the next sector to be recorded. The record operation will continue to record until either no additional sectors are supplied, or a terminate audio command is received. In the CPU mode, since memory is completely managed by the CPU or state machine over the serial interface, a record command will write into a memory sector regardless of whether it contains data prior to the record command being issued.

In the stand-alone mode, it was seen that an erase function erased the entire memory space. In the CPU mode, the CPU or state machine may issue the erase command followed by a particular sector number to erase. If a sector is not specified, the entire memory will be erased. Using this function, and the record and play functions described earlier, the CPU or state machine may directly manage the system, as opposed to the stand-alone which provides most of the management for the user.

While in CPU mode, in addition to performing the record, replay, and memory erase functions discussed earlier, the system may be operated at a more detailed level. For instance, memory data may be written to particular bytes of particular sectors, data contained in particular bytes of particular sectors may be replayed, and the erase function may be operated at the sector level, rather than at the chip level as in the user-operated stand alone mode.

Additional features present in the CPU mode which are not available in the user-operated stand-alone mode include receiving digital data into the system over the serial interface, and storing that digital data in memory. In this case, digital data presented to command interface 10 through the serial interface is routed through control interface 12, and is stored in memory 14.

In a "write to speaker" mode, a digital signal may be received over the serial interface, converted to analog using D/A converter 56, then filtered by filter section 20 and output to the speakers or other output device through pins 26 and 28.

In a "microphone" mode, an analog signal presented at the pre-amp inputs will be converted to digital using the A/D conversion chain and the digital data will then be presented on the serial I/O bus.

Referring again to command interface 10, in a presently preferred embodiment of the present invention, command interface 10 comprises a stand-alone interface 40 and a CPU interface 42. Although both interfaces are present in the system, only one may be operated at any given time. Here, if line 44 is held low, the system is in CPU mode, and interprets commands supplied over lines 46 using a serial protocol known in the art.

If, however, line 44 is brought high, the system is in stand-alone mode, and commands are interpreted based on whether neither, one, or both lines 46 are brought high. For instance, as shown below in Table 1, a play command may be issued when the first of lines 46 is brought high, and the second of line 46 remains low. A record command may be considered issued when the second of lines 46 is high when the first of lines 46 remains low. Further, an erase command may be issued when both of lines 46 are high at the same time.

TABLE 1

| Function | First of lines 46 | Second of lines 46 |
| --- | --- | --- |
| Standby | 0 | 0 |
| Play | 1 (momentary) | 0 |
| Skip | 1 (if message is currently playing) | 0 |
| Record | 0 | 1 (if memory space is avail.) |
| Play | 0 | 1 (if memory is full) |
| Erase | 1 | 1 |

Referring again to FIG. 1, in a presently preferred embodiment of the present invention, control interface 12 comprises command register 48 and controller 50. Command register 48 may comprise a lookup table containing instructions on how to proceed when a particular command is initiated through command interface 10. In a presently preferred embodiment of the present invention, however, command register 48 comprises an instruction decoder. This instruction decoder recognizes commands when they are presented, and doesn't actually perform an if-then type of behavioral analysis when a command is received. For instance, a play command may be represented by the two ascii characters "PL". When an instruction decoder "sees" a "PL", it instantly recognizes the familiar bit pattern, and acts upon that instruction as if there had actually been an if-then comparison performed on the command. Command register 48, after recognizing a command string, passes more detailed instructions to controller 50, and controller 50 then executes those instructions. In reality, these instructions are hardwired into logic gates, as determined by the logic synthesis. Command strings which are recognized as being correct by command register 48 are acknowledged over the serial port. Those strings that are not recognized are discarded without acknowledgement.

Referring again to D/A circuits 18, in a presently preferred embodiment of the present invention, D/A circuits 18 comprise sample-and-hold circuit 52, successive approximation register 54, digital to analog (D/A) converter 56, and comparator 58. Successive approximation as a means for converting signals between analog and digital forms is well-known in the art. In brief, for analog to digital conversion, a sample and hold circuit samples the incoming analog signal and temporarily stores it. A successive approximation register feeds digital bits into a D/A converter, until the output of the D/A converter matches the output of the sample and hold circuit. Initially, all bits of the D/A are set to zero. Then, beginning with the most significant bit, each bit is provisionally set to a 1, one bit at a time. If the output of the D/A does not exceed the analog input voltage, as determined by the comparator, the bit remains a 1. Otherwise, the bit is reset to a zero. In this manner, an n-bit D/A requires n-steps to determine the proper digital representation of the analog voltage.

In the present invention, sample-and-hold circuit 38 samples the output of de-multiplexer 64. Controller 50 then causes successive approximation register 54, beginning at the most significant bit and proceeding to the least significant bit, provisionally set each bit of D/A converter 56 to a 1, one bit at a time. Comparator 58 determines whether the incoming analog amplitude is greater or less than the output of the D/A Converter. Once all bits are determined, the data is routed to the proper place, depending on the command being acted upon.

A presently preferred embodiment of the present invention operates in the conventional manner, using sample-and-hold (S/H) circuit 52, successive approximation register 54, D/A converter 56, and comparator 58. Other methods of converting analog signals to digital form and for converting digital signals to analog form are well-known in the art. Although these well-known methods are within the scope and spirit of the present invention, it is preferred that the methods described herein be used, as they are more efficient and less time consuming than those other well-known methods.

Referring again to filter section 20, in a presently preferred embodiment of the present invention, filter section 20 comprises multiplexer 60 used for switching the input of anti-aliasing filter 62 between incoming signals from amplifier section 36 and other signals coming from sample-and-hold circuit 52, and de-multiplexer 64, used for switching the output of the filter section between the sample-and-hold 38 and the power amplifier 24. Control of multiplexer 60 and de-multiplexer 64 is achieved using controller 50, which switches the active input or output of the respective device depending on the command functions being accomplished at any given time.

Referring again to amplifier section 36, in a presently preferred embodiment of the present invention, amplifier section 36 comprises a standard operational amplifier 66 with AGC circuits 68. Pins 70 are supplied for the purpose of allowing the user to choose an external combination of a resistor and a capacitor which together control the hold time of the gain setting based upon the RC time constant of the external RC circuit.

Pins 72 and 74 are brought out to the external environment in order to provide flexibility. In a typical operating environment using a microphone to provide the analog input at pins 30 and 32, the signal is amplified in pre-amplifier 34, and then capacitively coupled to amplifier 66. Capacitive coupling is required in order to block any DC voltages from the input of the final amplifier which, if allowed to be present, would drive the amplifier into saturation. An alternative mode of operating the system provides that the user would supply line-level analog to pin 72, thereby bypassing pre-amplifier 34.

Figure 2A:
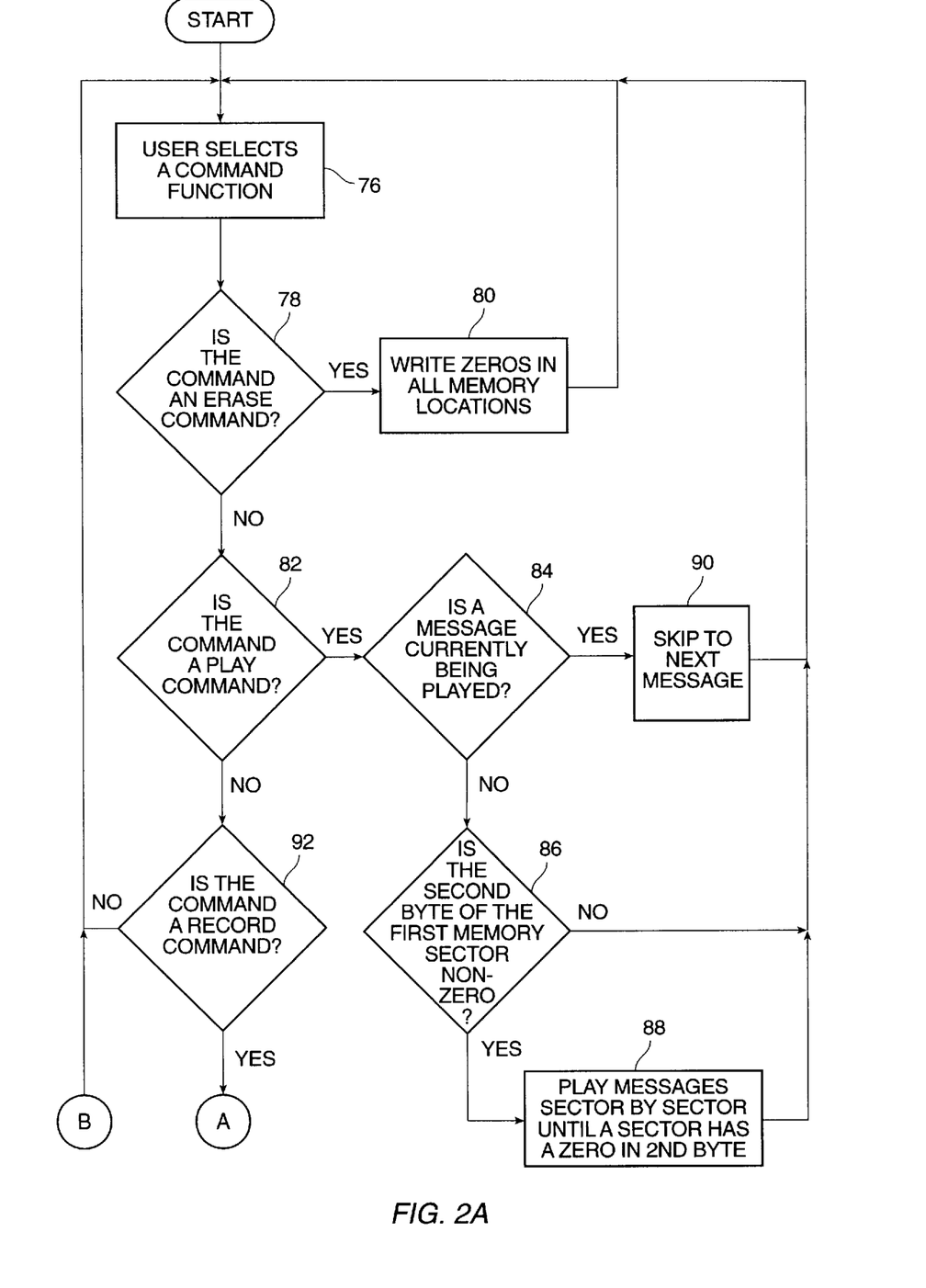
FIGS. 2A and 2B comprise a flow chart depicting the steps in the method of operating a presently preferred embodiment of the present invention in the stand-alone mode.
Figure 2B:
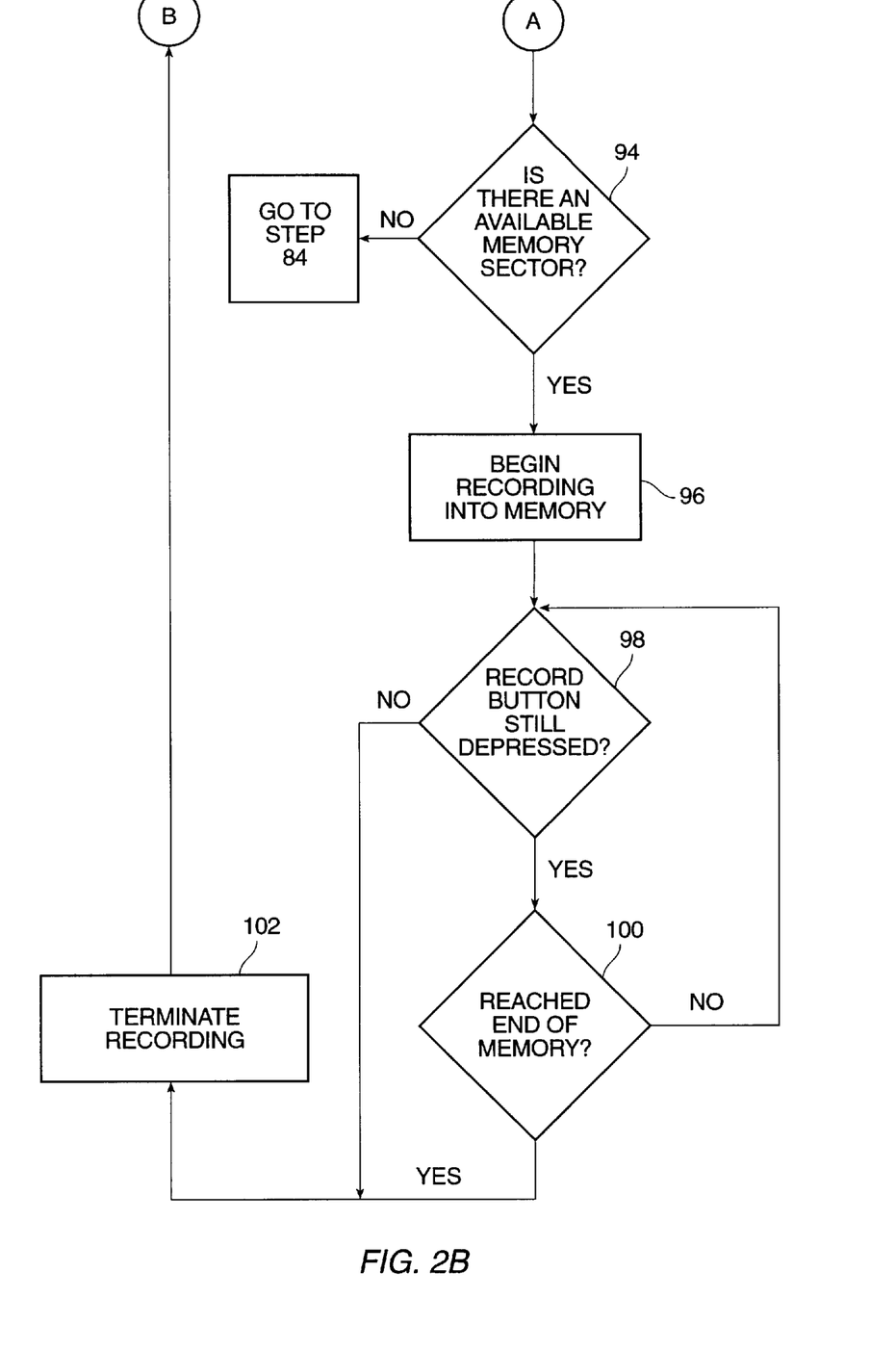

FIGS. 2A and 2B comprise a flow chart depicting the steps in the method of operating a presently preferred embodiment of the present invention in the user-operated stand-alone mode.

Referring to FIG. 2A, operation begins at step 76 where a user of the system selects a command function. In step 78 it is determined if the command is an erase command. If yes, in step 80 the system causes zeros to be written into the entire message storage space, thus erasing all messages stored there. If the command is not an erase command, the system proceeds with step 82, wherein it is determined if the command is a play command. If yes, step 84 determines if a message is already being played. If a message is not being played, step 86 verifies whether the second byte of the first memory sector is nonzero, thus ensuring that there is indeed a message to be played. If the second byte of the memory sector contains a zero, the sector is empty, and there is no message to be played. In this instance, the system ignores the command as having been entered in error and the command cycle begins again with step 76.

If there is a nonzero second byte in the first memory sector, step 88 plays messages, one sector at a time, until all messages have been played. The system then returns to the beginning of the flow chart at step 76, where the system waits for another command.

At step 84, it was previously determined that the play command was issued when another message was not already being played. If, however, a play command in step 84 was issued while a previous play command was already being executed, the subsequent play command is treated as a request to skip to the next message. In step 90, the actions necessary to skip to the next message are accomplished. The system continues to play messages, until the last message is played, and then returns back to step 76 awaiting a command to be issued by a user of the system.

If, in step 82, the command issued was not a play command, it is determined in step 92, whether the command was a record command. If no, an error has resulted, and the system returns to step 76, thus awaiting a new command to be issued. However, if the command was a record command, the flow chart proceeds to FIG. 2B. Here in step 94, the system determines if there is a sector which is available for recording, and in step 96 beings recording into that sector, if found. As discussed earlier, a zero in the second byte of a sector indicates that the sector is available for storing new data. If no sector is available for recording in step 94, then the system returns to step 84 where it is determined if a message is currently being played.

If, in step 98, the record command is still being issued, i.e. the button or other control is still in the record configuration, the system continues recording unless the end of memory is reached. If in step 100 the end of memory has been reached, the system proceeds with step 102 where recording is stopped, and the system then returns to step 76 in FIG. 2A, waiting for a new command to be issued.

If, in step 100, the end of memory has not been reached, the system continues to proceed back through step 98, checking the recording controls to ensure that recording is still activated. If, in step 98, it is determined that the record command is no longer being issued, the system continues with step 102 by terminating the recording process, and then returning to the beginning of the flow chart at step 76, where a new command is awaited.

Alternative embodiments comprise steps 78, 82, and 92 being presented in any of the five other possible orders. For instance, they could be presented in an order such as 82, 92, and 78 or such as 82, 78, 92, etc. It is readily apparent to those of ordinary skill in the art that decision blocks 78, 82, and 92, may be presented in several different orders and arrangements, while staying within the scope and spirit of the invention.

Figure 3A:
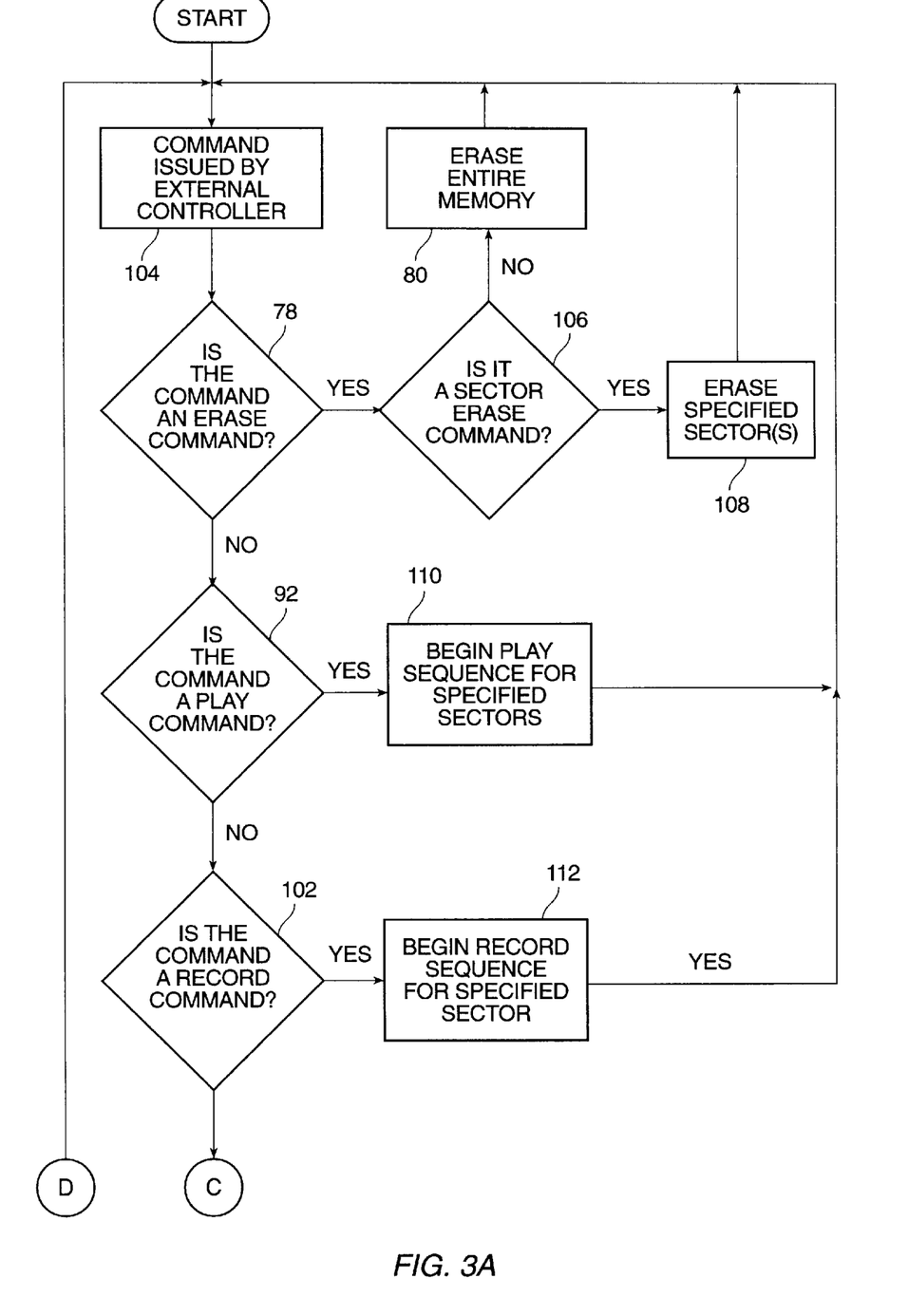
FIGS. 3A, 3B and 3C is a flow chart depicting the steps in the method of operating a presently preferred embodiment of the present invention in the CPU mode.
Figure 3B:
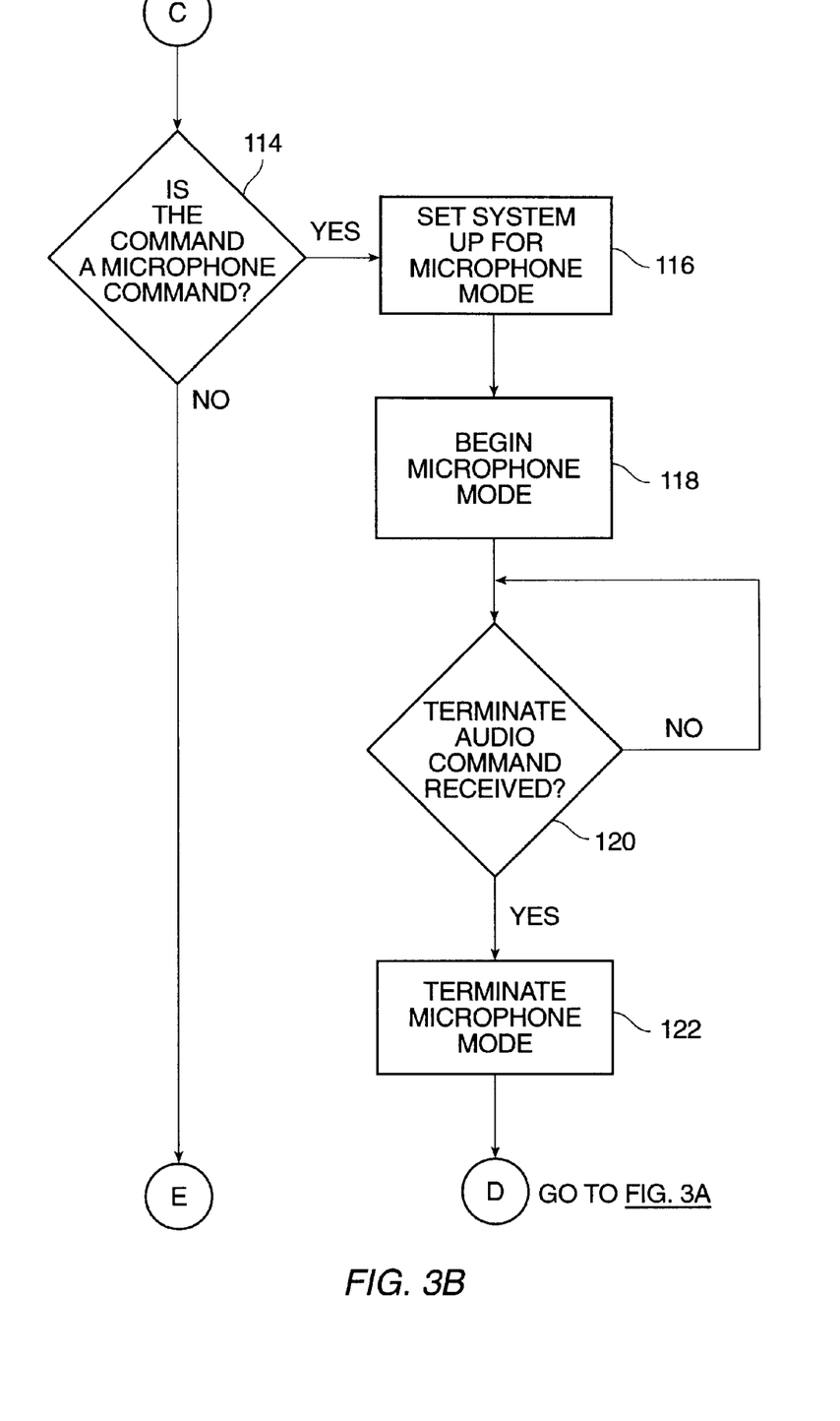

FIGS. 3A and 3B is a flow chart depicting the steps in the method of operating a presently preferred embodiment of the present invention in the CPU mode.

In describing FIG. 3A and FIG. 3B, it is assumed that the same checks as used in the user operated mode are also present in the CPU mode. For instance, when a play command is initiated, the system verifies that data is contained in the sector by checking for a nonzero second byte in the sector to be played. This step has been described and is implied in the CPU mode. It is intended that only the differences between the CPU and stand alone modes be described.

Referring to FIG. 3A, the system waits for a command in step 104. As in the user-operated stand-alone mode, when the system receives a command, step 78 determines if the command is an erase command. If yes, the system must now determine if the more sophisticated sector erase command is being used, rather then the total memory erase available in the stand-alone mode. If, in step 106, the command is determined to be a sector erase command, the system erases the specified sectors in step 108. If, however, in step 106 the command is not a sector command, step 80 is processed, thus erasing the entire memory storage area.

If the command was not an erase command in step 78, the system checks to see if the command is a play command in step 92. If yes, the specified sectors are played in step 110. If no sectors are specified, step 110 begins playing from the first sector and continues until either, a) the end of memory is reached, b) a terminate audio command is received, or c) two consecutive zero bytes are detected, thus signaling the end of the current message. In any case of a play command or record command initiating system processes, a terminate audio command will terminate that play or record command, and all associated processes.

If the command was not a play command in step 92, the system checks to see if the command is a record command in step 102. If yes, the specified sectors are recorded in step 112. If no sectors are specified, the first empty sector is located and recording is initiated. Recording then continues until either the end of memory is reached, or a terminate audio command is received.

Referring to FIG. 3B, if the command was not a record command in step 102, the system checks to see if the command is a microphone command in step 114. A microphone command allows the system to take digital data presented at input lines 46 (FIG.1), and convert that data to analog, using the system described earlier. The resulting analog signal is then presented at the output of power amplifier 24 for output to a speaker or other audio output device.

If the command is a microphone command, the systems proceeds to step 116 where the proper setup is performed in order for the data entering input line 46 to be properly converted and processed.

The microphone command begins in step 118, and continues until it is determined that a terminate audio command has been received in step 120, at which time step 122 terminates the command, and the system is returned to normal. The system continues to step 104, where the next command is awaited.

Figure 3C:
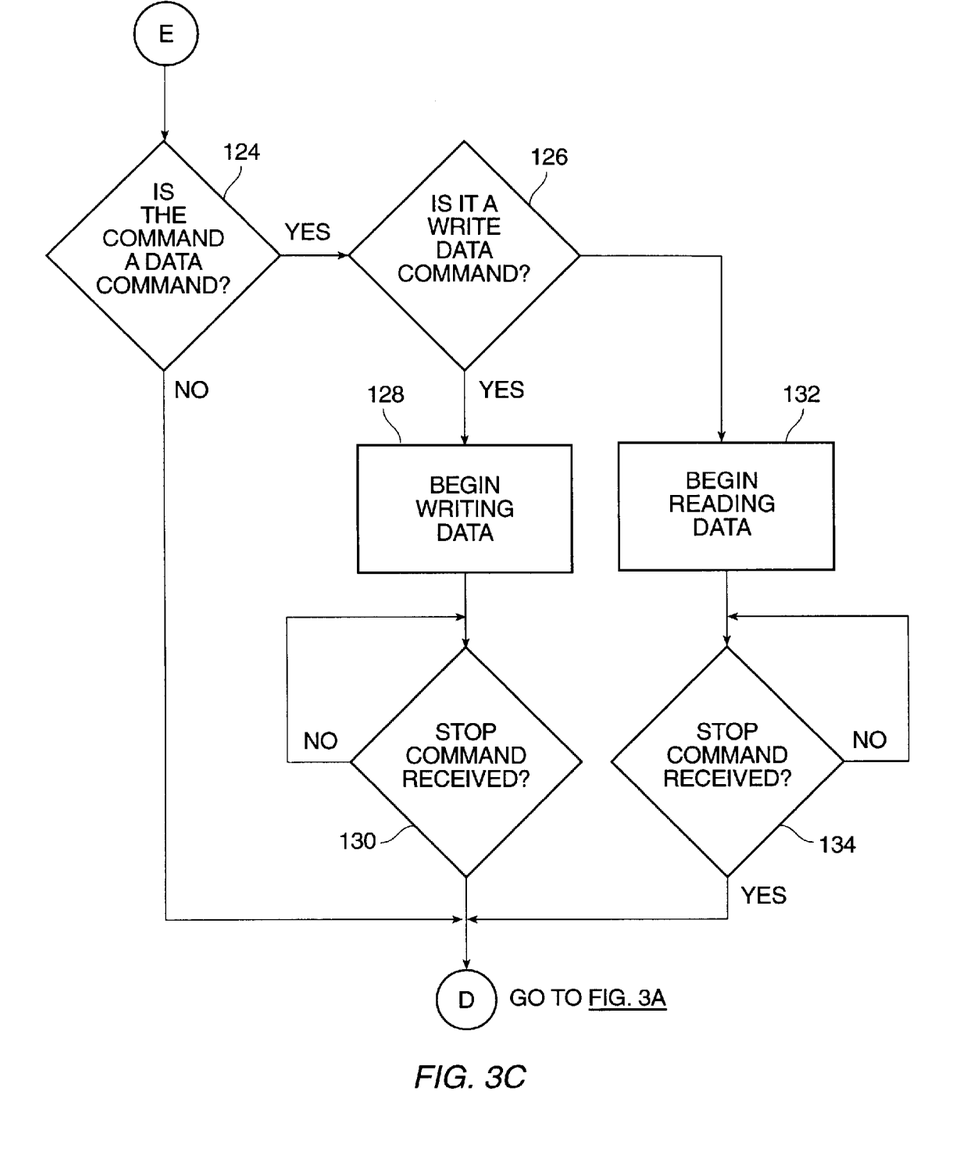

Referring to FIG. 3C, if the command in step 114 is not a microphone command, step 124 determines that the command was a data command. If the command is not a proper data command, the system ignores the input and returns to step 104 where it awaits a new command. If, however, a proper data command has been issued, the system proceeds to step 126 where it is determined if the intent was to write data, or to read data. If the command is a "write data" command, the system proceeds to step 128, and writes data directly to memory at the sector level to the locations specified when the command was issued. During the write command, step 130 watches for a "stop" command, and terminates the writing process if the stop command is issued.

An alternative embodiment includes writing information to memory or reading data from memory one byte at a time. This would allow a CPU to take complete and direct control of every memory function.

If the command in step 126 is not a write command, it is a read command, and the system begins reading in step 132 until either a stop command is issued, or all requested data sectors have been read. Step 134 will terminate the read data command if the stop command is issued.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An apparatus for record and playback of an audio signal comprising:
    an interface for interpreting external commands supplied using two switches;
    a controlling means, coupled to the output of said interface, for generating control signals in response to commands from said interface;
    an audio input means for supplying an audio signal;
    a means for converting analog signals to digital form, said means for converting analog signals to digital form having an input communicating with the output of said audio input means, and having an output;
    a memory having an input coupled to said output of said means for converting analog signals to digital form, and having an output, said memory responsive to said one of said control signals from one of said controlling means for reading and writing data;
    a means for converting digital information to analog form, said means for converting digital information to analog form having an input coupled to said output of said memory, and having an output; and
    an audio output means having an input coupled to said output of said means for converting digital information to analog form.

2. The apparatus of claim 1 wherein said audio input means includes an input amplifier.

3. The apparatus of claim 1 wherein the gain of said input amplifier is controlled using automatic gain control.

4. The apparatus of claim 1 wherein said audio output means includes a power amplifier.

5. The apparatus of claim 1 wherein said audio output means includes an equalizer.

6. The apparatus of claim 1 wherein said controlling means includes an oscillator having an output frequency responsive to ones of said control signals from said controlling means.

7. The apparatus of claim 1 further including an anti-aliasing filter having an input coupled to the output of said audio input means, and an output coupled to the input of said analog to digital conversion means.

8. The apparatus of claim 1 further including an anti-aliasing filter having an input coupled to the output of said digital to analog conversion means, and an output coupled to the input of said audio output means.

9. The apparatus of claim 1 further comprising:
    a multiplexer having a first input, a second input, and an output, said first input coupled to said output of said audio input means, and said second input coupled to said output of said digital to analog conversion means;
    an audio filter having an input coupled to said output of said multiplexer, and having an output;
    a de-multiplexer having an input, a first output, and a second output, said input coupled to said output of said audio filter, said first output coupled to said input of said analog to digital conversion means, and said second output coupled to said audio output means; and
    wherein said multiplexer and de-multiplexer switching are individually and separately controlled by said controlling means.

10. The apparatus of claim 1 wherein:
    one of said external commands, as interpreted by said interface, is deemed issued when a first one of said switches is momentarily depressed, and a second one of said two switches is disengaged.

11. The apparatus of claim 1 wherein:
    one of said external commands, as interpreted by said interface, is deemed issued when a command operation is in progress, a first one of said switches is depressed, and a second one of said two switches is disengaged.

12. The apparatus of claim 1 wherein:
    one of said external commands, as interpreted by said interface, is deemed issued when memory space is available for the storage of data, a first one of said switches is disengaged, and a second one of said two switches is depressed.

13. The apparatus of claim 1 wherein:
    one of said external commands, as interpreted by said interface, is deemed issued when memory space is not available for the storage of data, a first one of said switches is disengaged, and a second one of said two switches is depressed.

14. The apparatus of claim 1 wherein said two switches comprise a first switch and a second switch:
    a first command within a plurality of possible commands, as interpreted by said interface, is deemed issued when a command operation is in progress, a first one of said two switches is engaged, and a second one of said two switches is disengaged;
    a second command within a plurality of possible commands, as interpreted by said interface, is deemed issued when memory space is available for the storage of data, a first one of said two switches is disengaged, and a second one of said two switches is engaged;

a third command within a plurality of possible commands which may be issued using said two switches, as interpreted by said interface, is deemed issued when memory space is not available for the storage of data, a first one of said two switches is disengaged, and a second one of said two switches is engaged.

15. An apparatus for record and playback of an audio signal comprising:

a first interface for interpreting external commands supplied using no more than two switches;

a second interface for interpreting commands supplied over a serial interface;

a controlling means, coupled to the output of said first and second interfaces, for generating control signals in response to commands from said first and second interfaces;

an audio input means for supplying an audio signal to the system;

a means for converting analog signals to digital form, said means for converting analog signals to digital form having an input communicating with the output of said audio input means, and having an output;

a memory having an input coupled to said output of said means for converting analog signals to digital form, and having an output, said memory responsive to ones of said control signals from said controlling means for reading and writing data;

a means for converting digital information to analog form, said means for converting digital information to analog form having an input coupled to said output of said memory, and having an output; and an audio output means having an input coupled to said output of said means for converting digital information to analog form.

16. The apparatus of claim 15 wherein said audio input means includes an input amplifier.

17. The apparatus of claim 16 wherein the gain of said input amplifier is controlled using automatic gain control.

18. The apparatus of claim 15 wherein said audio output means includes a power amplifier.

19. The apparatus of claim 15 wherein said audio output means includes an equalizer.

20. The apparatus of claim 15 wherein said controlling means includes an oscillator having an output frequency responsive to ones of said control signals from said controlling means.

21. The apparatus of claim 15 further including an anti-aliasing filter having an input coupled to the output of said audio input means, and an output coupled to the input of said analog to digital conversion means.

22. The apparatus of claim 15 further including an anti-aliasing filter having an input coupled to the output of said digital to analog conversion means, and an output coupled to the input of said audio output means.

23. The apparatus of claim 15 further including a filter means, said filter means comprising:

a multiplexer having a first input, a second input, and an output, said first input coupled to said output of said audio input means, and said second input coupled to said output of said digital to analog conversion means;

an audio filter having an input coupled to said output of said multiplexer, and having an output; and a de-multiplexer having an input, a first output, and a second output, said input coupled to said output of said audio filter, said first output coupled to said input of said analog to digital conversion means, and said second output coupled to said audio output means.

24. A method for managing memory comprising the steps of:

providing a memory to be managed;

providing a search means connected to said memory, said search means capable of locating the first memory location within each memory sector;

providing a read means capable of reading the value of any memory location within said memory;

providing a controlling means connected to said memory, said search means, and said read means;

labeling the first memory sector as the current memory sector;

(a) directing said search means to locate the first memory location within the current memory sector;

(b) directing said read means to read the values of the first and second bytes of data beginning at said first memory location;

(c) if said first and second bytes of data both contain zeros, identifying the current memory sector as the first available storage location;

if said first byte is a zero and said second byte is nonzero, repeating process (a) through (c) above, incrementing the current memory sector by one until all available sectors have been interrogated, in which case the memory is identified as full.

25. A method for mapping the locations of message data stored in memory comprising the steps of:

providing a memory to be managed;

dividing said memory into a plurality of sectors of equal size;

providing a search means connected to said memory, said search means capable of locating the first memory location within each memory sector;

providing a read means capable of reading the value of any memory location within said memory;

providing a controlling means connected to said memory, said search means, and said read means;

labeling the first memory sector as the current memory sector;

(a) directing said search means to locate the first memory location within the current memory sector;

(b) directing said read means to read the values of the first and second bytes of data beginning at said first memory location;

(c) if said first and second bytes of data both contain zeros, identifying the current memory sector as empty;

if said first byte is a zero and said second byte is nonzero, identifying the current memory sector as the first sector of a message;

if no memory sector has yet been labeled as empty, repeating process (a) through (c) above, incrementing the current memory sector by one until all available sectors have been interrogated.

26. An apparatus for record and playback of an audio signal comprising:

an interface for interpreting more than four external commands supplied using no more than two switches;

a controlling means, coupled to the output of said interface, for generating control signals in response to commands from said interface;

an audio input means for supplying an audio signal;

a means for converting analog signals to digital form, said means for converting analog signals to digital form having an input communicating with the output of said audio input means, and having an output;

a memory having an input coupled to said output of said means for converting analog signals to digital form, and having an output, said memory responsive to said one of said control signals from one of said controlling means for reading and writing data;

a means for converting digital information to analog form, said means for converting digital information to analog form having an input coupled to said output of said memory, and having an output; and an audio output means having an input coupled to said output of said means for converting digital information to analog form.

* * * * *